United States Patent
Pollock et al.

(10) Patent No.: US 7,402,991 B2
(45) Date of Patent: Jul. 22, 2008

(54) WIDE BANDWIDTH ATTENUATOR INPUT CIRCUIT FOR A MEASUREMENT PROBE

(75) Inventors: Ira G. Pollock, Hillsboro, OR (US); William A. Hagerup, Portland, OR (US); Paul G. Chastain, Portland, OR (US); William Q. Law, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/693,628

(22) Filed: Mar. 29, 2007

(65) Prior Publication Data

US 2007/0164730 A1     Jul. 19, 2007

Related U.S. Application Data

(62) Division of application No. 11/123,752, filed on May 6, 2005, now Pat. No. 7,256,575.

(60) Provisional application No. 60/575,980, filed on Jun. 1, 2004.

(51) Int. Cl.
    *G01R 1/20* (2006.01)
(52) U.S. Cl. .................................... 324/126
(58) Field of Classification Search ............. None
    See application file for complete search history.

(56) References Cited

U.S. PATENT DOCUMENTS

| 6,841,987 B2 * | 1/2005 | Clegg et al. ............. 324/115 |
| 7,256,575 B2 * | 8/2007 | Pollock et al. ............ 324/142 |

* cited by examiner

*Primary Examiner*—Ha Nguyen
*Assistant Examiner*—Trung Q. Nguyen
(74) *Attorney, Agent, or Firm*—William K. Bucher

(57) ABSTRACT

A wide bandwidth attenuator input circuit for a measurement probe has a $Z_0$ attenuator circuit coupled in series with a compensated RC attenuator circuit. The series attenuator elements of the $Z_0$ and the compensated RC attenuator circuits are coupled via a controlled impedance transmission line to the shunt attenuator elements of the $Z_0$ and the compensated RC attenuator circuits. The shunt element of the $Z_0$ attenuator element terminates the transmission line in its characteristic impedance. The junction of the series and shunt attenuator elements are coupled to the input of a buffer amplifier. At low and intermediate frequencies, the compensated RC attenuator circuit attenuates an input signal while at high frequencies, the compensated RC attenuator circuit acts as a short and the $Z_0$ attenuator circuits attenuates the input signal.

7 Claims, 4 Drawing Sheets

WIDE BANDWIDTH ATTENUATOR INPUT CIRCUIT FOR A MEASUREMENT PROBE

CROSS-REFERENCE TO RELATED APPLICATION

This divisional application claims the benefit of priority of U.S. patent application Ser. No. 11/123,752, filed May 6, 2005 now U.S. Pat. No. 7,256,575 which claim the benefit of priority of U.S. Provisional Application No. 60/575,980, filed Jun. 1, 2004.

BACKGROUND OF THE INVENTION

The present invention related generally to input attenuator circuits for voltage measurement probes and more particularly to a wide bandwidth attenuator input circuit that combines the attributes of conventional active probe input circuits and $Z_0$ input circuits.

Conventional active voltage probes exhibit finite and reactive input impedance characteristics that can load a circuit under test at frequencies greater than 1 GHz to perturb the measurement being made. The perturbation may be great enough to induce failure in the circuit, or at least, to bring the results of the measurement into question.

Referring to FIG. 1, there is shown a simplified schematic of a conventional active probe input circuit 10 that includes a probe buffer amplifier 12 with a damped compensated attenuator input. The probe amplifier 12 is located in the probe head in order to drive the probe cable transmission line that is coupled to the measurement instrument, such as an oscilloscope or the like. The probe amplifier 12 also needs to be located physically close to the probing tip in order to reduce interconnect parasitics and maintain high frequency response. A compensated RC passive attenuator having a parallel resistive/capacitive pair R1 and C1 acting as the series elements of the attenuator and parallel resistive/capacitive pair R2 and C2 acting as the shunt elements of the attenuator is commonly used in front of the probe amplifier 12 to increase the probe input dynamic range and reduce the effective probe input capacitance. The compensated RC attenuator structure is used to provide flat transmission response over a broad frequency range. The simplifies schematic of FIG. 1 also includes an input damping resistor 14, which is used to adjust the probe risetime and aberrations. The damping resistor 14 may have some effect on the probe high frequency loading depending on the probe tip parasitics. The conventional active probe the impedance is usually very high at low frequencies because of the input resistance, but begins to drop off at 20 dB/decade due to the effect of the input capacitance.

A newer probe input structure uses a current mode amplifier approach as representatively shown in FIG. 2. The current mode amplifier 20 has a resistive input element 22 coupled to parallel resistive/capacitive elements R1 and C1. The parallel resistive/capacitive elements R1 and C1 are coupled to a coaxial transmission line 24 in the form of a coaxial cable. The other end of the coaxial cable 24 is series coupled to a resistive element 26 that terminates the coaxial cable 24 in its characteristic impedance. The resistive element 24 is coupled to the inverting input of a transimpedance probe amplifier 28 that has the non-inverting input coupled to ground. The inverting input node of the transimpedance probe amplifier 28 is coupled to the output of the amplifier via a parallel resistive/capacitive elements R2 and C2. The attenuated input voltage signal is converted to a current signal at the probe amplifier 28 virtual ground node. The resulting current signal is then converted by the amplifier feedback components R2 and C2 to a buffered output voltage. Although the passive input network is not a conventional compensated attenuator structure, because of the large coaxial cable capacitance, the amplifier topology makes the feedback components R2 and C2 act like the shunt elements of a compensated attenuator with the probe head components, resistive elements 22, R1 and 26, and capacitor C1 acting as the series elements.

SUMMARY OF THE INVENTION

Accordingly, the present invention is a wide bandwidth input attenuation circuit for an active voltage measurement probe receiving an input signal from a device under test. The wide bandwidth input attenuation circuit has a compensated RC voltage divider network having series resistive/capacitive elements coupled to shunt resistive/capacitive elements. A resistive $Z_0$ voltage divider network has a series resistive element coupled to a shunt resistive element where the series resistive element is coupled to the series resistive/capacitive elements of the compensated RC voltage divider network and the shunt resistive element is coupled to the shunt resistive/capacitive elements of the compensated RC voltage divider network. A transmission line couples the series resistive/capacitive elements of the compensated RC voltage divider network to the shunt resistive element of the resistive $Z_0$ voltage divider network with the shunt resistive/capacitive elements of the compensated RC voltage divider network coupled in series with the shunt resistive element of the resistive $Z_0$ voltage divider network. The junction of the transmission line with the shunt resistive element of the resistive $Z_0$ voltage divider network is coupled to a buffer amplifier.

The transmission line may be implemented as a co-planar transmission line or as a coaxial cable that may be a lossless cable or a resistive cable. The shunt resistive element of the resistive $Z_0$ voltage divider network has a resistive value substantially equal to the characteristic impedance of the transmission line.

A wide bandwidth differential input attenuation circuit for an active voltage measurement probe may be formed using two wide bandwidth input attenuation circuits. Each wide bandwidth input attenuation circuit is coupled to receive one of the complementary positive and negative signals of a differential signal. The complementary positive and negative signals from the input attenuator circuits are taken from the junction of the first transmission line with the shunt resistive element of the first resistive $Z_0$ voltage divider network and the junction of the second transmission line with the shunt resistive element of the second resistive $Z_0$ voltage divider network. The differential signal is coupled to first and second inputs of a differential amplifier.

In a further embodiment, the wide bandwidth differential input attenuation circuit for an active voltage measurement probe has first and second high frequency signal paths receiving the differential input signal. Each high frequency signal path has a resistive $Z_0$ voltage divider network with the resistive $Z_0$ voltage divider network having a series resistive element coupled to a shunt resistive element via a series connected transmission line and a blocking capacitor. A differential active low pass filter circuit is coupled across the blocking capacitors with the active low pass filter circuit having a low pass characteristic matched to the frequency response of the respective first and second high frequency signal paths. A differential amplifier is coupled to receive the attenuated differential input signal with the first input of the differential amplifier coupled to the junction of the shunt resistive element of the first resistive $Z_0$ voltage divider network in the first high frequency signal path and the second input of the differential amplifier coupled to the junction of the shunt resistive element of the second resistive $Z_0$ voltage divider network in the second high frequency path.

The differential active low pass filter circuit may be implemented as a voltage amplifier circuit having first and second inputs coupled to the first and second high frequency signal paths prior to the blocking capacitors. The voltage amplifier circuit receives the differential input signal and generates an amplified low pass filtered differential output signal having complementary positive and negative component signals. The positive component signal is coupled to the first high frequency signal path after the first high frequency signal path blocking capacitor and the negative component signal is coupled to the second high frequency signal path after the second high frequency signal path blocking capacitor. The differential active low pass filter circuit may further be implemented as a transconductance amplifier circuit with the differential input signal being coupled from the first and second high frequency signal paths to the amplifier. As with the voltage amplifier circuit, the transconductance amplifier circuit is coupled across the blocking capacitors of the first and second high frequency signal paths with the complementary positive and negative component signals of the differential output signal being respectively coupled to the first and second high frequency signal paths.

The objects, advantages and novel features of the present invention are apparent from the following detailed description when read in conjunction with appended claims and attached drawings.

DETAILED DESCRIPTION OF THE PREFERRED EMBODIMENT

Figure 1:
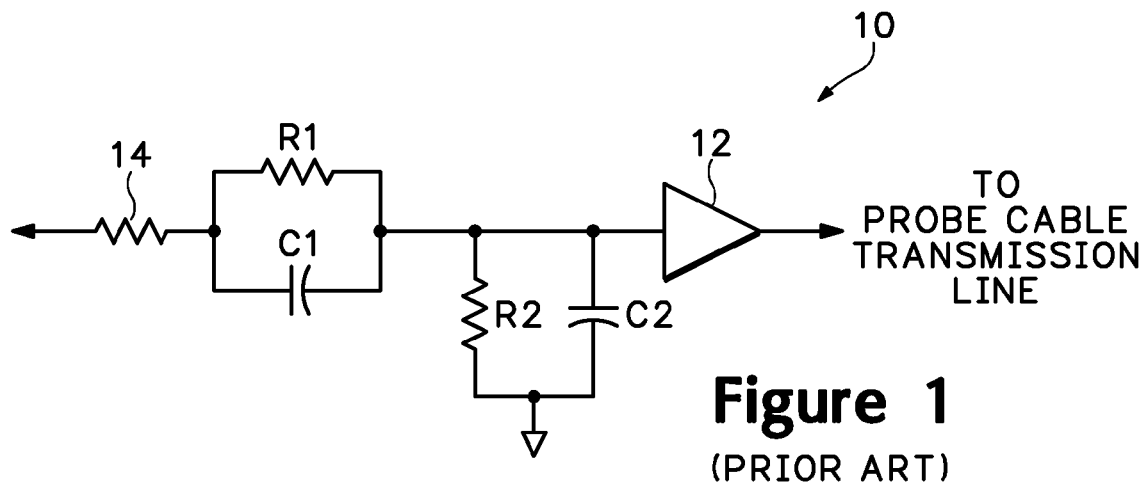
FIG. 1 is a representative schematic representation of a conventional active probe input circuit for a measurement probe.
Figure 2:
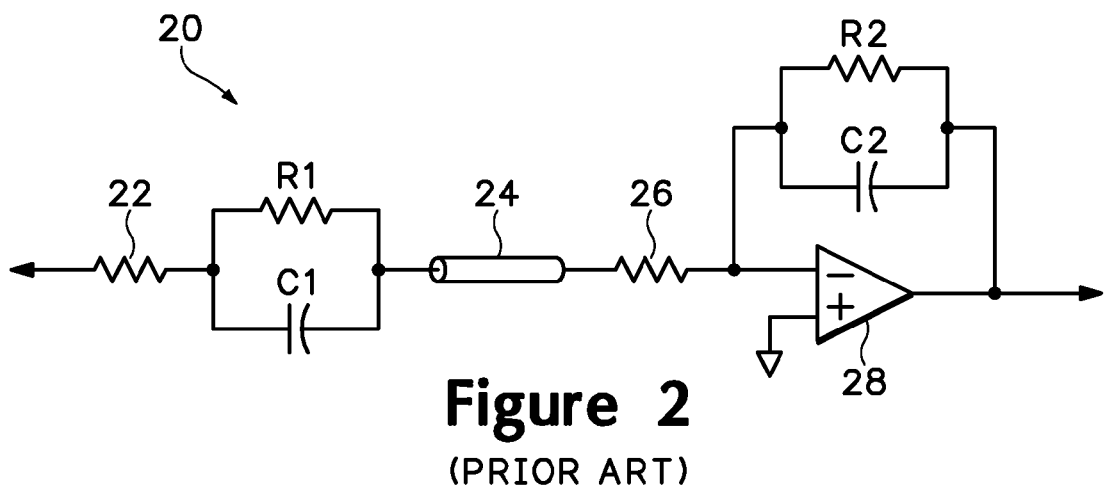
FIG. 2 is a representative schematic representation of a current mode amplifier approach for an active measurement probe.
Figure 3:
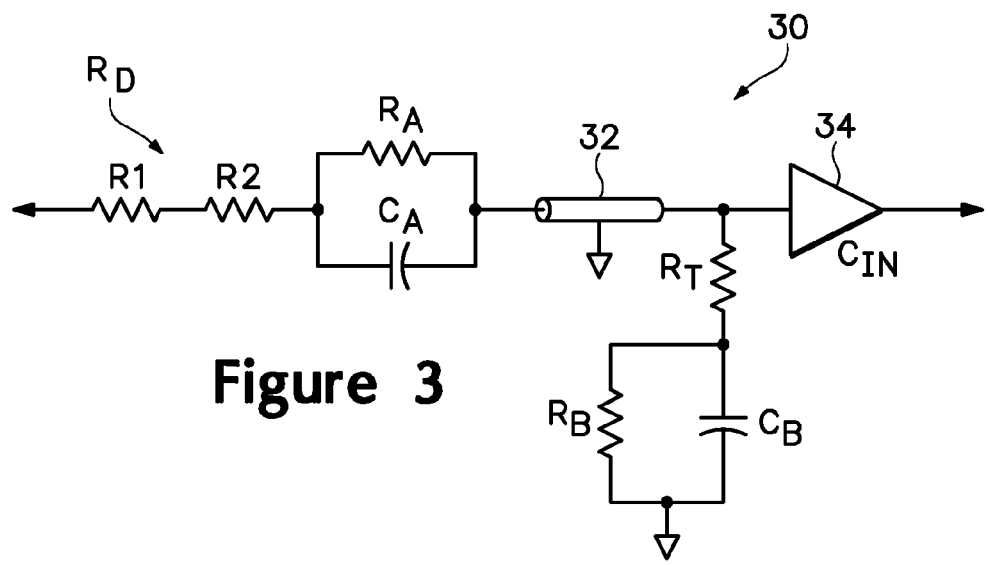
FIG. 3 is a schematic representation of a first embodiment of the wide bandwidth attenuator input circuit according to the present invention.

Referring to FIG. 3, there is shown a first embodiment of the wide bandwidth attenuator input circuit 30 for a measurement probe of the present invention. The wide bandwidth attenuator input circuit has a resistive element $R_D$ that is implemented as a series combinations of a probing tip resistance element R1 and an attenuator resistive element R2 functioning as a series element of a $Z_0$ attenuation circuit. The resistive element is coupled to a first resistive/capacitive pair $R_A$ and $C_A$ acting as the series elements of a compensated RC attenuator circuit. The first resistive/capacitive pair $R_A$ and $C_A$ is coupled to one side a controlled impedance transmission line 32. The other side of the controlled impedance transmission line 32 is coupled to a termination resistive element $R_T$ for the transmission line 32 that also functions as the stunt element of the $Z_0$ attenuation circuit. The termination resistive element $R_T$ is coupled to a second resistive/capacitive pair $R_B$ and $C_B$ acting as the shunt elements of the compensated $R_C$ attenuator circuit. A buffer amplifier 34 having an input capacitance of $C_{IN}$ is coupled to the junction node of the transmission line 32 with the termination resistive element $R_T$.

The resistance of the probing tip resistive element R1 has a preferred value in the range of 50 to 150 ohms. The resistance of the attenuator resistive element R2 is a function of the characteristic impedance of the transmission line and the attenuation factor for the $Z_0$ attenuation circuit according to the equation $R2=(a-1)\times Z_0 - Z_{tip}$ where "a"=the attenuation factor, $Z_0$ is the resistance $R_T$ and $Z_{tip}$ is the resistance of R1. In the preferred embodiment the attenuation factor "a" is 4. The resistive element R1 isolates the parasitics at the probe tip while the attenuator resistive element R2 is trimmed to provide the desired attenuation factor for the $Z_0$ attenuation circuit. This is in contrast to the conventional active probe input circuit 10 where the damping resistor 14 is trimmed for risetime and aberrations. The resistive values of $R_A$ and $R_B$ are at least an order of magnitude higher than the resistive values of $R_D$ and $R_T$.

The controlled impedance transmission line 32 may be implemented as a lossless transmission line, such as a coplanar transmission line, microstrip line or the like, or as a resistive coaxial cable transmission line. The transmission line 32 has a delay $T_D$ and a resistance of $R_s$. For a lossless transmission line, $R_s$ is has a value of "0" while the resistive transmission line has a value of 10 to 50 ohms per foot. In the preferred embodiment, the resistive transmission line has a length of approximately 6 cm and a resistance of approximately 4 ohms. Transmission line theory indicates that for a lossless transmission line, a resistive element is sufficient to terminate the transmission line in its characteristic impedance as represented by the below equation:

$$C_B + C_{IN} = \frac{2 \times T_{DS}}{R_S}$$

where $T_{DS}$ is the delay of the transmission line and $R_S$ is the resistance of the transmission line. In the case of the wide bandwidth attenuator input circuit 30, the buffer amplifier 34 has a fixed input capacitance $C_{IN}$ and $C_B$ is in series with the termination resistor $R_T$. Where the resistance Rs of the transmission line 32 is "0" $C_B$ goes to infinity which indicating a short across the capacitance leaving $R_T$ terminating the transmission line. In the case where the transmission line 32 has resistance, the termination of the transmission line requires a resistive element in series with a capacitive element. In the case of the wide bandwidth attenuator input circuit 30, Rs has a resistive value of approximately 4 ohms which results in the $C_B$ having a capacitive value that is in series with the termination resistor $R_T$.

In operation, DC to low frequency input signals are attenuated by the resistive attenuator $R_A$ and $R_B$ since the resistive contributions of $R_D$ and $R_T$ are insignificant compared to the values of the resistive attenuator $R_A$ and $R_B$. At intermediate frequencies up to a few Gigahertz, input signals are attenuated by the compensated RC attenuator of $R_A/C_A$ and $R_B/C_B$. At frequencies above the bandpass of the compensated RC attenuator, the input signals are attenuated by the $Z_0$ attenuator circuit of $R_D$ and $R_T$ where $C_A$ and $C_B$ are effectively shorts for a lossless transmission line and $C_B$ has a capacitive value in series with $R_T$ for a resistive transmission line. $R_T$ and the series combination of $C_A$ and $C_B$ form a frequency domain pole that extends the bandwidth of wide bandwidth attenuator input circuit 30 over the conventional active probe input circuit 10.

It should be noted that the $Z_0$ attenuator circuit and the compensated RC attenuator circuit may implemented with R2 in series with $C_A$ and parallel with $R_A$ and $R_T$ in series with $C_B$ and parallel with $R_B$. This implementation is electrically equivalent to having R2 in series with the parallel combination of $R_A$ and $C_A$ and $R_T$ in series with the parallel combination of $R_B$ and $C_B$. At DC and low frequencies, the capacitive reactance of the $C_A$ and $C_B$ act as open circuits causing the input signals to pass through the resistive attenuator of $R_A$ and $R_B$. As the frequencies of the input signals increase, the capacitive reactance of $C_A$ and $C_B$ decreases causing the input signals to pass through the compensated RC attenuator circuit of $R_A/C_A$ and $R_B/C_B$. Above the bandpass of the compensated RC attenuator circuit, $C_A$ and $C_B$ essentially become short circuits with the input signals being attenuated by the $Z_0$ attenuator circuit of $R_D$ and $R_T$.

Figure 4:
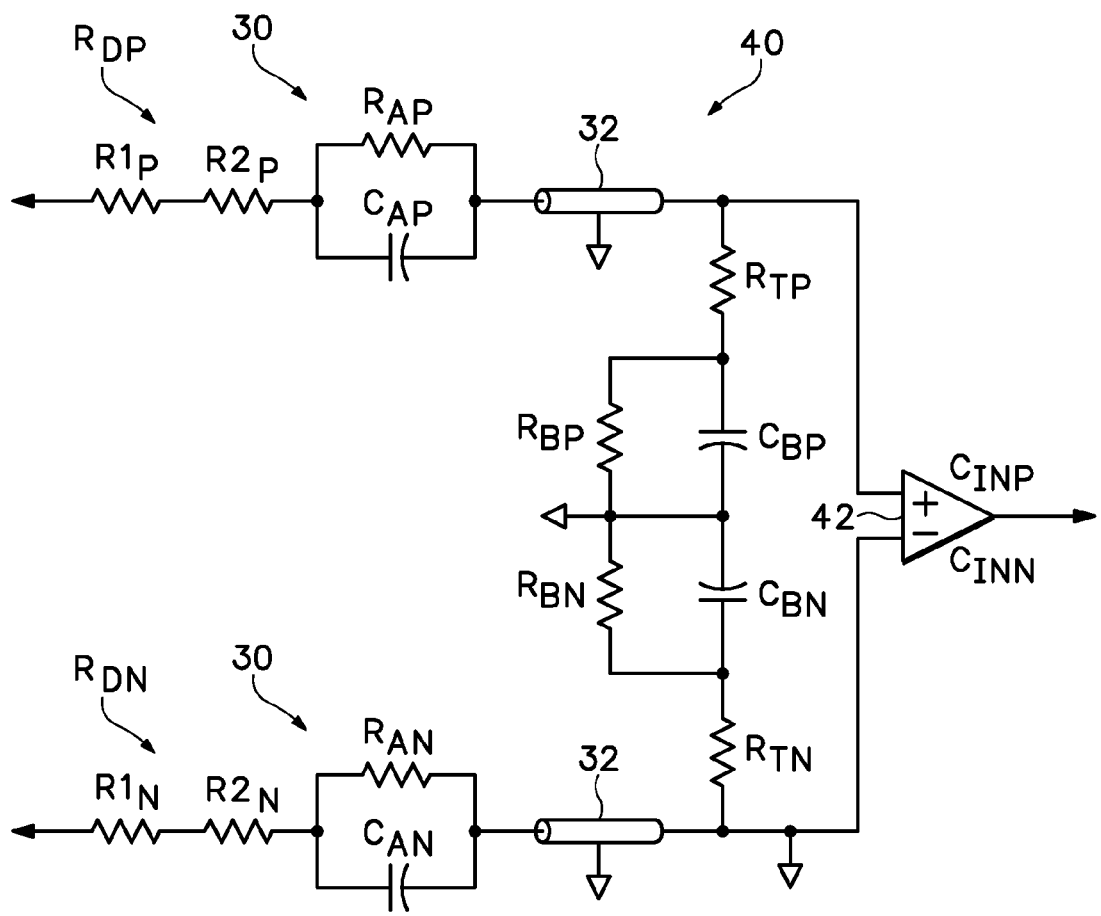
FIG. 4 is a schematic representation of the first embodiment of the wide bandwidth attenuator input circuit used in a differential input circuit according to the present invention.

Referring to FIG. 4, there is shown the wide bandwidth attenuator input circuit 30 incorporated into a differential wide bandwidth attenuator input circuit 40. The differential wide bandwidth attenuator input circuit 40 has substantially identical wide bandwidth attenuator input circuits 30 coupled to the inverting and non-inverting inputs of the differential buffer amplifier 42. The resistive value of $R_{DP}$ is the same as the resistive value of $R_{DN}$. The resistive value of $R_{AP}$ is the same as the resistive value of $R_{AN}$ and the resistive value of $R_{BP}$ is the same as the resistive value of $R_{BN}$. $C_{AP}$ has the same capacitive value as $C_{AN}$ and $C_{BP}$ has the same capacitive value as $C_{BN}$. The resistive values of $R_{TP}$ and $R_{TN}$ are the same. The differential input signal having complementary positive and negative component signals is coupled to the two differential input channels of the wide bandwidth attenuator input circuits 30 and attenuated in the same manner as previously described and applied to the input of the differential amplifier 42. The differential amplifier 42 generates an output signal that is coupled to the measurement instrument.

Figure 5:
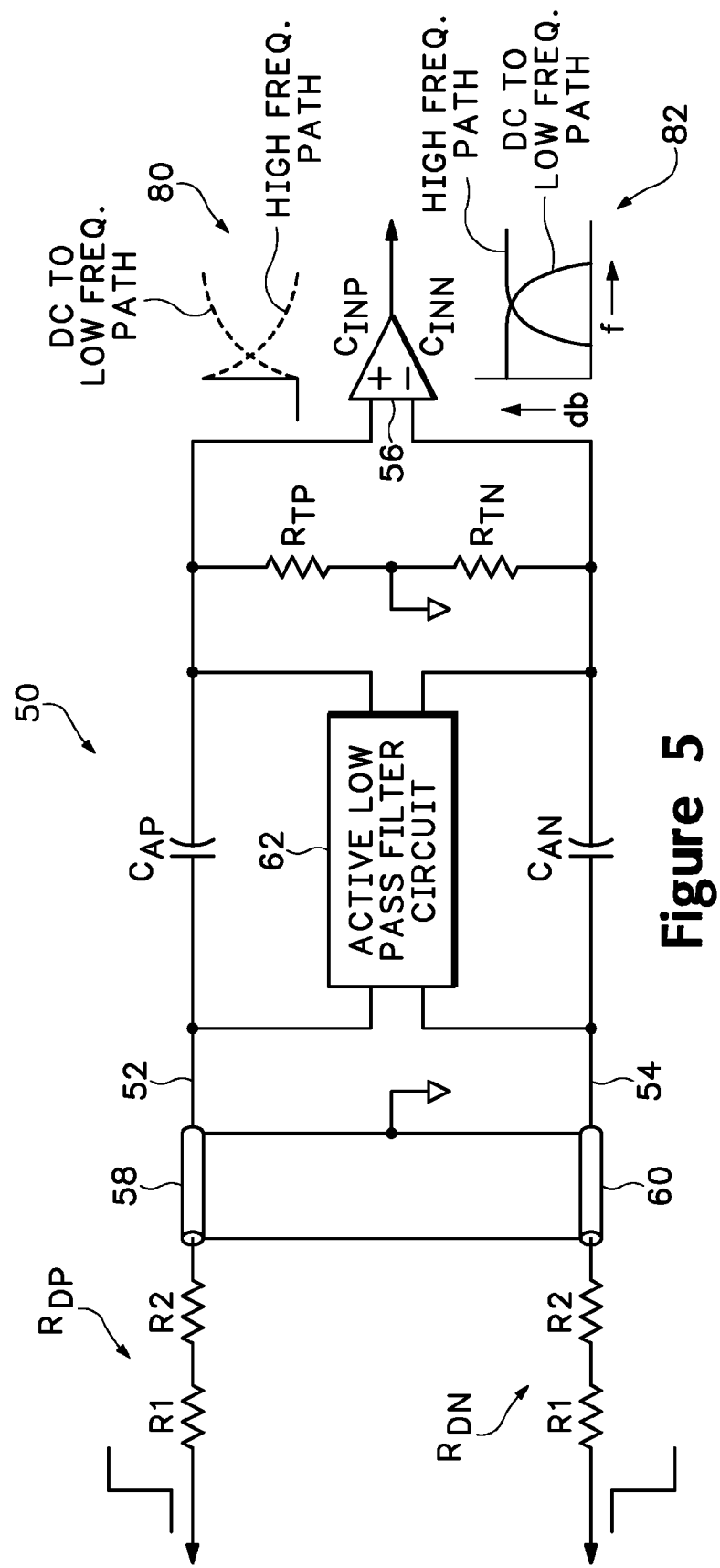
FIG. 5 is further embodiment of the wide bandwidth attenuator input circuit according to the present invention.

Referring to FIG. 5, there is shown a further embodiment of the wide bandwidth attenuator input circuit of the present invention. The wide bandwidth attenuator input circuit 50 is a differential input circuit having separate high frequency input signal paths 52 and 54 that are coupled to inverting and no-inverting input nodes of a differential amplifier 56. Each high frequency input signal path 52, 54 has a input resistive element $R_{DP}$, $R_{DN}$ that may consist of resistive elements R1 and R2 as previously described. The resistive elements $R_{DP}$, $R_{DN}$ are coupled to respective controlled impedance transmission lines 58, 60. The controlled impedance transmission lines 58, 60 may be implemented as lossless or resistive transmission lines as previously described. The transmission lines 58, 60 are coupled to respective resistive termination elements $R_{TP}$ and $R_{TN}$ via blocking capacitors $C_{AP}$ and $C_{AN}$. The other ends of the resistive termination elements $R_{TP}$ and $R_{TN}$ are coupled to ground. Each high frequency signal path 52, 54 forms a $Z_0$ attenuator circuit consisting of the input resistance element $R_{DP}$, $R_{DN}$, the controlled impedance transmission line 58, 60, and the resistive termination element $R_{TP}$ and $R_{TN}$. Each $Z_0$ attenuator circuit in combination with the respective blocking capacitors $C_{AP}$ and $C_{AN}$ forms a high pass filter circuit. Coupled across the blocking capacitors $C_{AP}$ and $C_{AN}$ is a differential active low pass filter circuit 62 for coupling DC through intermediate frequency signals to the inputs of the differential amplifier 56. The differential active low pass filter circuit 62 needs to have a low pass characteristic that is matched to the frequency response of the high pass filter characteristics of the high frequency input paths 52, 54 consisting of respectively $R_{DP}$, $C_{AP}$, $R_{TP}$ and $R_{DN}$, $C_{AN}$, $R_{TN}$ to achieve a flat overall frequency response from DC to near the bandwidth of the differential amplifier 56.

Figure 6A:
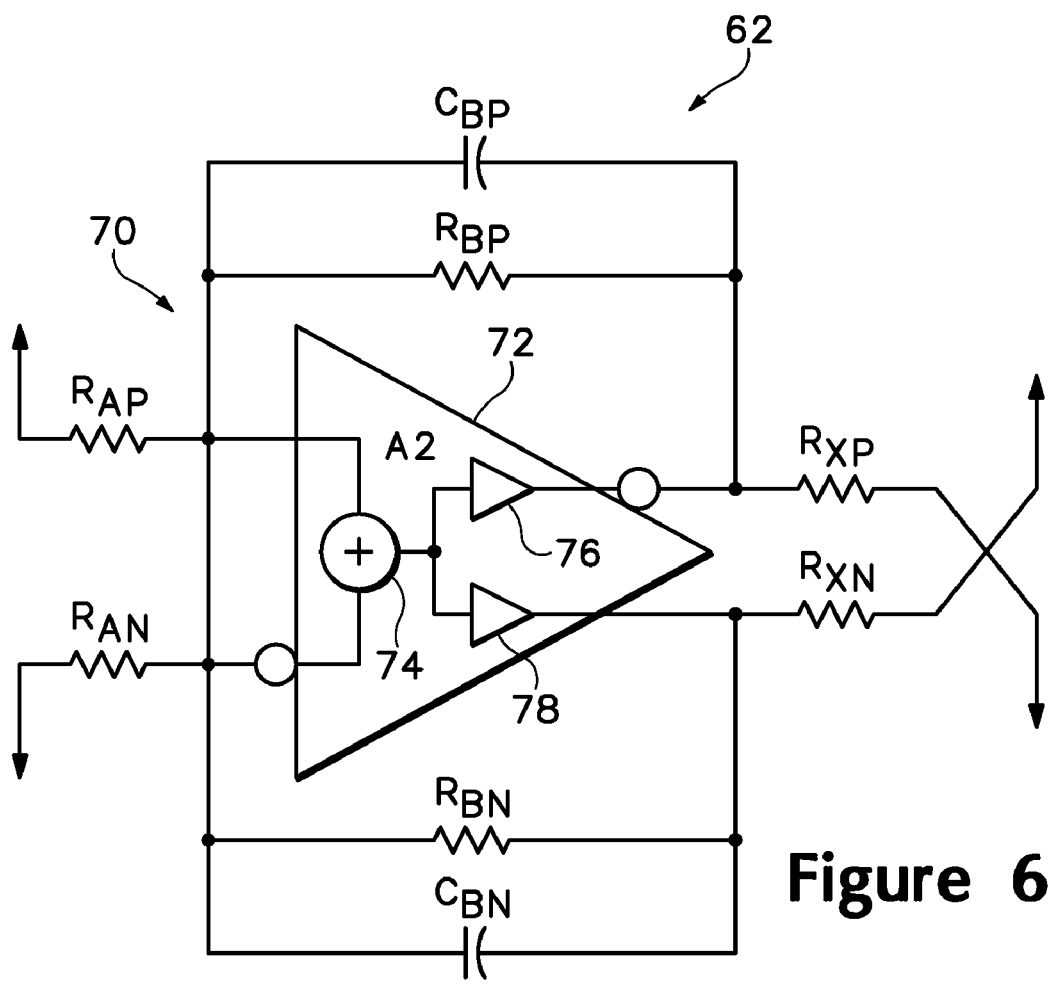
FIGS. 6A and 6B are schematic representations of alternative differential active low pass filter circuits used in the wide bandwidth attenuator input circuit according to the present invention.
Figure 6B:
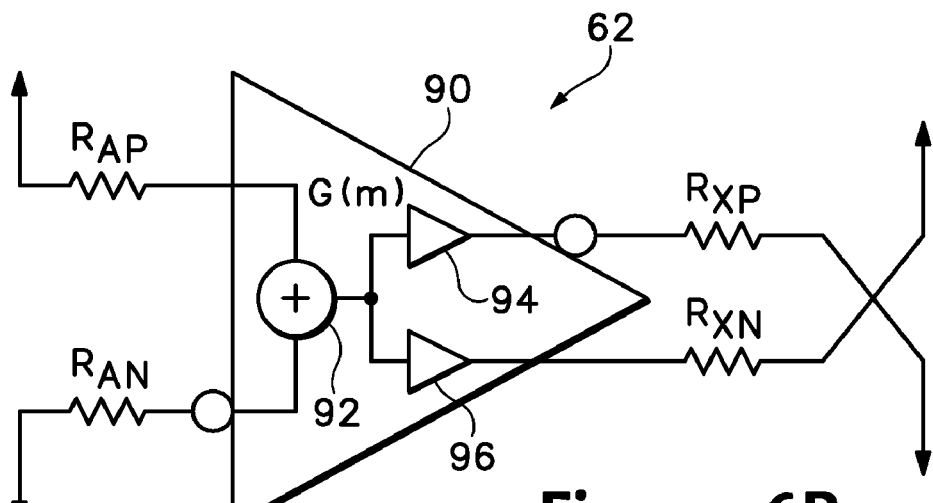

FIGS. 6A and 6B illustrate two embodiment of the differential active low pass filter circuit 62. FIG. 6A illustrates voltage amplifier circuit 70 having first and second inputs for receiving the differential input signal and generating an amplified, low pass filtered differential output signal coupled to first and second outputs. First and second high frequency signal paths 52, 54 are tapped prior to the blocking capacitors $C_{AP}$ and $C_{AN}$ to provide the differential input signal to the first and second inputs of a voltage amplifier 72 via input resistors $R_{AP}$ and $R_{AN}$ where $R_{AP}$ and $R_{AN}$ have resistive values that present a high impedance to the differential input signal at low frequencies. Within the voltage amplifier, one of the complementary positive and negative signals of the differential input signal is inverted and summed with the other complementary differential signal in a summing circuit 74 to reject common mode signals that may be present on the differential input signal. In the specific embodiment of FIG. 6A, the complementary negative signal is inverted. The summed differential input signal is coupled to separate amplifier circuits 76, 78 and amplified. The output of one of the amplifiers 76, 78 is inverted to generate the amplified, low pass filtered differential output signal. Alternately, the separate amplifier circuits 76, 78 could be a single differential output stage. Resistive-capacitive feedback elements $R_{BP}$, $C_{BP}$ and $R_{BN}$, $C_{BN}$ are coupled between the respective first input and output and the second input and output. The impedance of the feedback elements varies as a function of the frequency of the differential input signal producing a low pass filtered differential output signal. The complementary negative low pass filtered signal is coupled to second high frequency signal path 54 after the blocking capacitor $C_{AN}$ via output resistor $R_{XP}$ and the complementary positive low pass filtered signal is coupled to the first high frequency signal path 52 after the blocking capacitor $C_{AP}$ via output resistor $R_{XN}$. The voltage amplifier 72 has low impedance outputs resulting in $R_{XN}$ being in parallel with $R_{TN}$ and $R_{XP}$ being in parallel with $R_{TP}$. Therefore, the resistance values for the parallel combinations of $R_{XN}$ with $R_{TN}$ and $R_{XP}$ with $R_{TP}$ need to be set so that the resulting parallel resistances match the impedances of the controlled impedance transmission lines 58, 60.

The high pass filtered differential signal on the first and second high frequency signal paths 52, 54 is combined with the low pass filtered differential output signal from the voltage amplifier circuit 70 to generate a common mode rejected differential signal having frequency response from DC to greater than 15 GHz. The common mode rejected differential signal is coupled to the inputs of the differential amplifier 56. The step response of the common mode rejected differential signal at the input to the differential amplifier 56 is the combination of the step responses of the high pass filtered first and second high frequency input signal paths 52, 54 and the step response of the low pass filter voltage amplifier circuit 70 as represented by the time response graph 80. The frequency response of the common mode rejected differential signal at the input to the differential amplifier 56 is the combination of the frequency responses of the low pass filter voltage amplifier circuit 70 and the high pass filtered first and second high frequency input signal paths 52, 54 as represented by the frequency response graph 82. A flat frequency response occurs when $\tau$ for the circuit equals $C_{BP} \times R_{BP} = C_{AP} \times (Z_0 \times$ $R_{DP})/(Z_0+R_{DP})$ where $Z_0$ equals $R_{TP}$ and $C_{BN} \times R_{BN} = C_{AN} \times (Z_0 \times R_{DN})/(Z_0+R_{DN})$ where $Z_0$ equals $R_{TN}$.

The circuit of FIG. 6A may also by implemented using other circuit designs or methods using off the self components or an application specific integrated circuit (ASIC) so long as the result has a one-pole, low pass response, which in combination with the high frequency paths 52, 54 produces a flat low to intermediate frequency response.

FIG. 6B illustrates an transconductance amplifier 90 having a transconductance of "gm" and first and second inputs for receiving the differential input voltage signal and generating an amplified, low pass filtered differential output current signal coupled to first and second outputs. First and second high frequency signal paths 52, 54 are tapped prior to the blocking capacitors $C_{AP}$ and $C_{AN}$ to provide the differential input signal to the first and second inputs of the transconductance amplifier 90 via input resistors $R_{AP}$ and $R_{AN}$. As with the previously described voltage amplifier circuit 70, $R_{AP}$ and $R_{AN}$ have resistive values that present a high impedance to the differential input signal at low frequencies. Within the transconductance amplifier, one of the complementary positive and negative signals of the differential input signal is inverted and summed with the other complementary differential signal in a summing circuit 92 to reject common mode signals that may be present on the differential input signal. In the specific embodiment of FIG. 6B, the complementary negative signal is inverted. The summed differential input signal is coupled to separate transconductance amplifier circuits 94, 96 and amplified. The output of one of the transconductance amplifiers 76, 78 is inverted to generate the amplified, low pass filtered differential output current signal. Alternately, the separate transconductance amplifier circuits 76, 78 could be a single differential transconductance amplifier output stage. The complementary negative low pass filtered current signal is coupled to second high frequency signal path 54 after the blocking capacitor $C_{AN}$ via output resistor $R_{XP}$ and the complementary positive low pass filtered current signal is coupled to the first high frequency signal path 52 after the blocking capacitor $C_{AP}$ via output resistor $R_{XN}$. The combination of the high impedance outputs of the transconductance amplifier 90 and the output resistors $R_{XP}$ and $R_{XN}$ provides a high impedance to $R_{TP}$ and $R_{TN}$. As a result, the resistive values of $R_{TP}$ and $R_{TN}$ are set to match the impedances of the controlled impedance transmission lines 58, 60. A flat frequency response occurs when $\tau$ for the circuit equals $C_{AP} \times (Z_0 \times R_{DP})/(Z_0+R_{DP})$ where $Z_0$ equals $R_{TP}$ and $C_{AN} \times (Z_0 \times R_{DN})/(Z_0+R_{DN})$ where $Z_0$ equals $R_{TN}$.

An advantage of the above described wide bandwidth attenuator input circuit 50 is a the reduction in the number of capacitors in the high frequency input paths 52, 54. In the previously described differential circuit, each of the high frequency circuits have two capacitors $C_{AP}$, $C_{BP}$ and $C_{AN}$, $C_{BN}$. Blocking capacitors can generate parasitics at high frequencies so reducing the number of capacitors in the high frequency input paths 52, 54 reduces the chances of unwanted parasitics. The ability to terminate $R_{TP}$ and $R_{TN}$ directly to ground improves the high speed termination design, allowing termination on an integrated circuit implementation of the design. In addition, the differential active low pass filter circuit 62 does not pass common mode signals at low frequencies simplifying biasing of the differential amplifier 56 since many very high speed differential amplifiers have limited DC common mode range. Further, any trimming is done in the differential active low pass filter circuit 62 and not in the high frequency input paths 52, 54.

It will be obvious to those having skill in the art that many changes may be made to the details of the above-described embodiments of this invention without departing from the underlying principles thereof. The scope of the present invention should, therefore, be determined only by the following claims.

What is claimed is:

1. A wide bandwidth differential input attenuation circuit for an active voltage measurement probe receiving a differential input signal from a device under test comprising:

first and second high frequency signal paths receiving the differential input signal with each high frequency signal path having a resistive $Z_0$ voltage divider network with the resistive $Z_0$ voltage divider network having a series resistive element coupled to a shunt resistive element via a series connected transmission line and a blocking capacitor, the first and second high frequency signal paths having a high pass filter frequency response;

a differential active low pass filter circuit coupled across the blocking capacitors of the first and second high frequency signal paths with the differential active low pass filter circuit receiving the differential input signal from the first and second high frequency signal paths prior to the blocking capacitors and generating a low pass filtered differential signal coupled to the first and second high frequency signal paths after the blocking capacitors with the differential active low pass filter circuit having a low pass characteristic matched to the frequency response of the respective first and second high frequency signal paths; and a differential amplifier having first and second inputs with the first input of the differential amplifier coupled to the junction of the shunt resistive element of the first resistive $Z_0$ voltage divider network in the first high frequency signal path and the second input of the differential amplifier coupled to the junction of the shunt resistive element of the second resistive $Z_0$ voltage divider network in the second high frequency path.

2. The wide bandwidth differential input attenuation circuit as recited in claim 1 wherein the differential active low pass filter circuit comprises a voltage amplifier circuit having first and second inputs coupled to the first and second high frequency signal paths prior to the blocking capacitors of the first and second high frequency signal paths and receiving the differential input signal and generating an amplified low pass filtered differential output signal having complementary positive and negative component signals with positive component signal being coupled to the first high frequency signal path after the blocking capacitor of the first high frequency signal path and the negative component signal being coupled to the second high frequency signal path after the blocking capacitor of the second high frequency signal path.

3. The wide bandwidth differential input attenuation circuit as recited in claim 1 wherein the differential active low pass filter circuit comprises a transconductance amplifier circuit having first and second inputs coupled to the first and second high frequency signal paths prior to the blocking capacitors of the first and second high frequency signal paths and receiving the differential input signal and generating an amplified low pass filtered differential current signal having complementary positive and negative component signals with positive component signal being coupled to the first high frequency signal path after the blocking capacitor of the first high frequency signal path and the negative component signal being coupled to the second high frequency signal path after the blocking capacitor of the second high frequency signal path.

4. The wide bandwidth differential input attenuation circuit as recited in claim 1 wherein the first and second transmission lines are co-planar transmission lines.

5. The wide bandwidth differential input attenuation circuit as recited in claim 1 wherein the first and second transmission lines are coaxial cables.

6. The wide bandwidth differential input attenuation circuit as recited in claim 1 wherein the coaxial cables have a resistive signal conductor.

7. The wide bandwidth differential input attenuation circuit as recited in claim 1 wherein the shunt resistive element of the first and second resistive $Z_0$ voltage divider networks have resistive values substantially equal to the characteristic impedance of the first and second transmission lines.

* * * * *